(12) United States Patent
Yu et al.

(10) Patent No.: US 10,879,160 B2
(45) Date of Patent: Dec. 29, 2020

(54) SEMICONDUCTOR PACKAGE WITH PACKAGING SUBSTRATE

(71) Applicant: SK hynix Inc., Icheon-si (KR)

(72) Inventors: Jae Woong Yu, Guri-si (KR); So Hyun Jung, Seongnam-si (KR)

(73) Assignee: SK hynix Inc., Icheon-si (KR)

( * ) Notice: Subject to any disclaimer, the term of this patent is extended or adjusted under 35 U.S.C. 154(b) by 36 days.

(21) Appl. No.: 16/221,105

(22) Filed: Dec. 14, 2018

(65) Prior Publication Data

US 2019/0237397 A1    Aug. 1, 2019

(30) Foreign Application Priority Data

Feb. 1, 2018   (KR) .................. 10-2018-0013119
Jul. 2, 2018   (KR) .................. 10-2018-0076700

(51) Int. Cl.
*H01L 23/498*   (2006.01)
*H05K 3/46*   (2006.01)
(Continued)

(52) U.S. Cl.
CPC ....... *H01L 23/49822* (2013.01); *H05K 3/423* (2013.01); *H05K 3/4652* (2013.01);
(Continued)

(58) Field of Classification Search
CPC ..... H01L 23/49822; H01L 2924/15311; H01L 2224/48227; H01L 23/49816; H01L 23/49838; H01L 2224/81455; H01L 2224/81444; H01L 24/73; H01L 2224/73265; H01L 2224/16227; H01L 2224/85455; H01L 24/16; H01L 24/81; H01L 2224/48228; H01L 2224/48465; H01L 2224/48091; H01L 24/85; H01L 2224/85444; H01L 24/48; H01L 2224/32225; H01L 2924/00012; H01L 2924/00014; H01L 23/498; H05K 3/42; H05K 3/46; H05K 3/4652; H05K 3/23; H05K 1/0296; H05K 1/116; H05K 3/423; H05K 2201/0949; H05K 2203/049
(Continued)

(56) References Cited

U.S. PATENT DOCUMENTS

2001/0005050 A1* 6/2001 Ohsawa .................. H01L 23/24
  257/704
2006/0091523 A1* 5/2006 Shimanuki ........ H01L 23/49816
  257/698
(Continued)

FOREIGN PATENT DOCUMENTS

KR     100385225 B1    5/2003
KR     100891334 B1    3/2009
KR    1020160010246 A    1/2016

*Primary Examiner* — Alexander O Williams
(74) *Attorney, Agent, or Firm* — William Park & Associates Ltd.

(57) ABSTRACT

The semiconductor package includes a package substrate. The package substrate includes a base layer, a first group of conductive lines disposed on a first surface of the base layer, and a second group of conductive lines disposed on a second surface of the base layer and electrically connected to respective ones of the first group of conductive lines. The package substrate further includes a plating lead line connected to one of the first group of conductive lines.

19 Claims, 11 Drawing Sheets

(51) Int. Cl.
*H05K 3/42* (2006.01)
*H01L 23/00* (2006.01)

(52) U.S. Cl.
CPC .... *H01L 24/48* (2013.01); *H01L 2224/48091* (2013.01); *H01L 2224/48227* (2013.01); *H01L 2924/15311* (2013.01)

(58) Field of Classification Search
USPC ......................................................... 257/678
See application file for complete search history.

(56) References Cited

U.S. PATENT DOCUMENTS

2007/0292993 A1* 12/2007 Tanoue ............... H01L 21/4846
438/123
2019/0237398 A1* 8/2019 Yu ..................... H01L 23/49822

* cited by examiner

SEMICONDUCTOR PACKAGE WITH PACKAGING SUBSTRATE

CROSS-REFERENCE TO RELATED APPLICATIONS

The present application claims priority under 35 U.S.C 119(a) to Korean Patent Application Nos. 10-2018-0013119 and 10-2018-0076700, filed on Feb. 1, 2018, and Jul. 2, 2018, respectively, which are herein incorporated by references in their entirety.

BACKGROUND

1. Technical Field

The present disclosure generally relates to semiconductor packages.

2. Related Art

Each of semiconductor packages is configured to include a package substrate on which at least one semiconductor chip is mounted. The package substrate includes interconnection lines that are electrically connected to the semiconductor chip. Portions of the interconnection lines may be coated with a plating layer being in contact with connectors of the semiconductor package. The plating layer may improve the bondability between the interconnection lines and the connectors as well as the electric conductivity of the interconnection lines.

SUMMARY

According to an embodiment, a semiconductor package includes a semiconductor chip and a package substrate on which the semiconductor chip is mounted. The package substrate includes a base layer having a first surface and a second surface which are opposite to each other, a first bonding finger disposed on the first surface of the base layer, a plating lead line disposed on the first surface of the base layer to be spaced apart from the first bonding finger, a first conductive via and a second conductive via substantially penetrating the base layer to be electrically connected to the first bonding finger and the plating lead line respectively, a first remaining portion electrically connected to the first conductive via, a second remaining portion electrically connected to the second conductive via, a first opening hole located between the first remaining portion and a dam portion such that the first remaining portion is electrically disconnected from the dam portion, a second opening hole located between the second remaining portion and the dam portion such that the second remaining portion is electrically disconnected from the dam portion, and a dielectric layer disposed on the second surface of the base layer to cover the first remaining portion, the dam portion, and the second remaining portion and is penetrated by the first and second opening holes.

According to an embodiment, a semiconductor package includes a semiconductor chip and a package substrate on which the semiconductor chip is mounted. The package substrate includes a base layer having a first surface and a second surface which are opposite to each other, a first group of conductive lines disposed on the first surface of the base layer, a second group of conductive lines disposed on the second surface of the base layer and electrically connected to respective ones of the first group of conductive lines, a plating lead line electrically connected to one of the first group of conductive lines, a conductive line from the second group of conductive lines includes a dam portion located between a first opening hole and a second opening hole of the conductive line, the first opening hole located between a first remaining portion of the conductive line and the dam portion and the second opening hole located between a second remaining portion of the conductive line and the dam portion such that the dam portion is electrically disconnected from the first and second remaining portions, and a dielectric layer disposed on the second surface of the base layer to cover the first and second remaining portions and the dam portion and is penetrated by the first and second opening holes.

DETAILED DESCRIPTION

Figure 1:
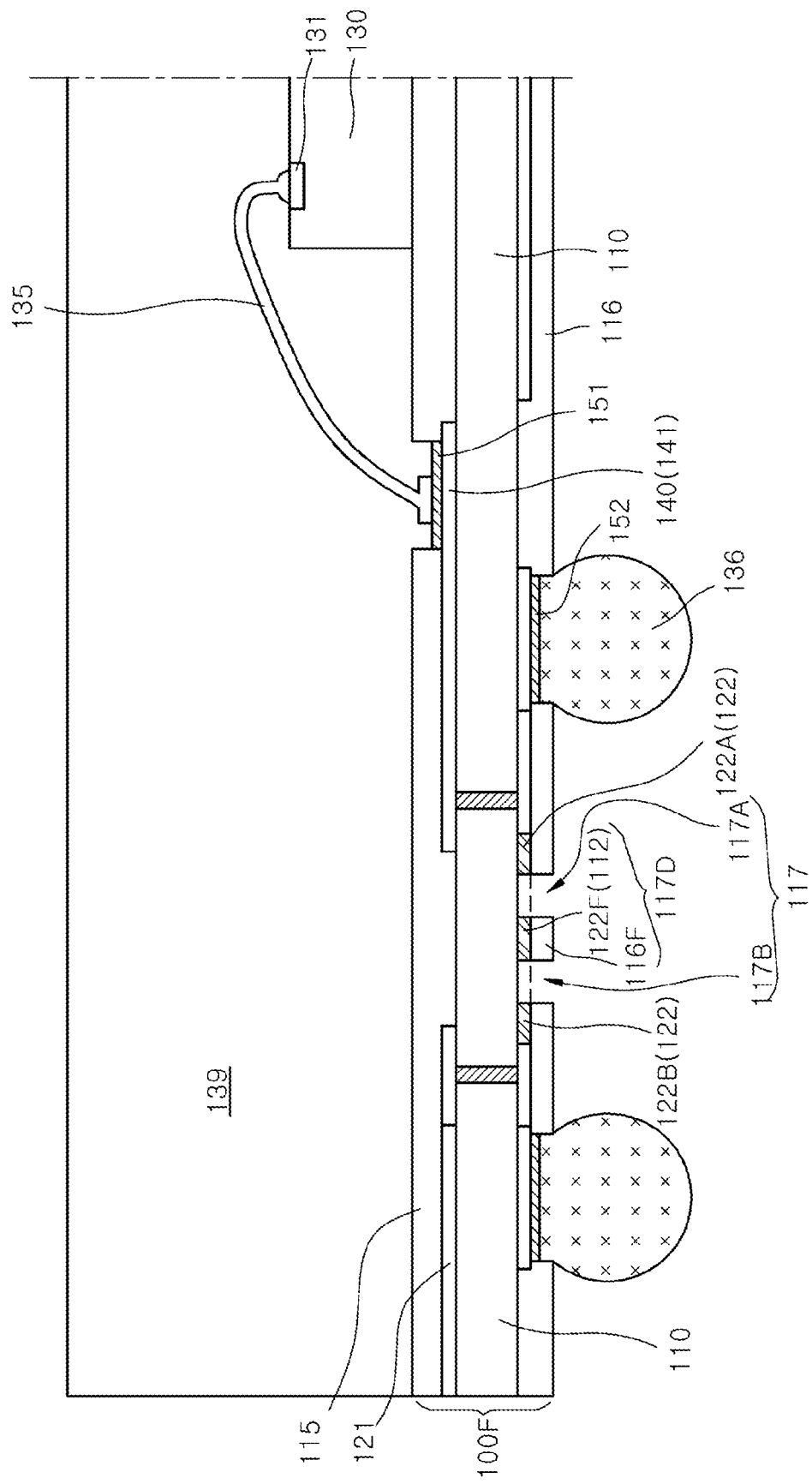
FIG. 1 is a cross-sectional view illustrating a semiconductor package according to an embodiment of the present disclosure.

The terms used herein may correspond to words selected in consideration of their functions in the embodiments, and the meanings of the terms may be construed to be different according to ordinary skill in the art to which the embodiments belong. If defined in detail, the terms may be construed according to the definitions. Unless otherwise defined, the terms (including technical and scientific terms) used herein have the same meaning as commonly understood by one of ordinary skill in the art to which the embodiments belong.

It will be understood that although the terms "first," "second," "third" etc. may be used herein to describe various elements, these elements should not be limited by these terms. These terms are only used to distinguish one element from another element, but not used to define only the element itself or to mean a particular sequence.

It will also be understood that when an element or layer is referred to as being "on," "over," "below," "under," or "outside" another element or layer, the element or layer may be in direct contact with the other element or layer, or intervening elements or layers may be present. Other words used to describe the relationship between elements or layers should be interpreted in a like fashion (e.g., "between" versus "directly between" or "adjacent" versus "directly adjacent").

Spatially relative terms, such as "beneath," "below," "lower," "above," "upper," "top," "bottom" and the like, may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, when the device in the figures is turned over, elements described as below and/or beneath other elements or features would then be oriented above the other elements or features. The device may be otherwise oriented (rotated 90 degrees or at other orientations) and the spatially relative descriptors used herein interpreted accordingly.

A semiconductor package may include electronic devices such as semiconductor chips or semiconductor dies. The semiconductor chips or the semiconductor dies may be obtained by separating a semiconductor substrate such as a wafer into a plurality of pieces using a die sawing process. The semiconductor chips may correspond to memory chips, logic chips (including application specific integrated circuits (ASIC) chips), or system-on-chips (SoC). The memory chips may include dynamic random access memory (DRAM) circuits, static random access memory (SRAM) circuits, NAND-type flash memory circuits, NOR-type flash memory circuits, magnetic random access memory (MRAM) circuits, resistive random access memory (ReRAM) circuits, ferroelectric random access memory (FeRAM) circuits or phase change random access memory (PcRAM) circuits which are integrated on the semiconductor substrate. The logic chips may include logic circuits which are integrated on the semiconductor substrate. The semiconductor package may be employed in communication systems such as mobile phones, electronic systems associated with biotechnology or health care, or wearable electronic systems.

Same reference numerals refer to same elements throughout the specification. Even though a reference numeral is not mentioned or described with reference to a drawing, the reference numeral may be mentioned or described with reference to another drawing. In addition, even though a reference numeral is not shown in a drawing, it may be mentioned or described with reference to another drawing.

In a semiconductor package, a semiconductor chip may be mounted on a package substrate. The package substrate may be configured to include interconnection lines that are electrically connected to the semiconductor chip. Portions of the interconnection lines may be coated with a plating layer being in contact with connectors of the semiconductor package. The plating layer may improve the bondability between the interconnection lines and the connectors as well as the electric conductivity of the interconnection lines.

The plating layer may be formed using an electrolytic plating process. The interconnection lines may be connected to plating lines in order to form the plating layer using an electrolytic plating process. The plating lines may be long conductive patterns that extend from an edge of the package substrate to be connected to the interconnection lines (acting as signal lines). The plating lines may be conductive lines that are necessary to the electrolytic plating process. However, the plating lines do not function as the interconnection lines which are used as signal lines while the semiconductor package operates.

While the semiconductor package operates, the plating lines may act as undesirable transmission lines such as stubs. If the plating lines are connected to the signal lines, the plating lines may function as detour paths of signals or reflection paths of signals. Since the plating lines undesirably reflect the signals, the plating lines may degrade a transmission speed of the signals, operation characteristics of the semiconductor package, or a signal integrity of the semiconductor package. The present disclosure provides semiconductor packages, each of which includes a package substrate with plating lines having a reduced total length.

Variation of external environment such as humidity or temperature may cause electro-chemical migration (ECM) failure of a package substrate. The present disclosure provides semiconductor packages, each of which employs a package substrate that is capable of suppressing or preventing the ECM failure.

Figure 2:
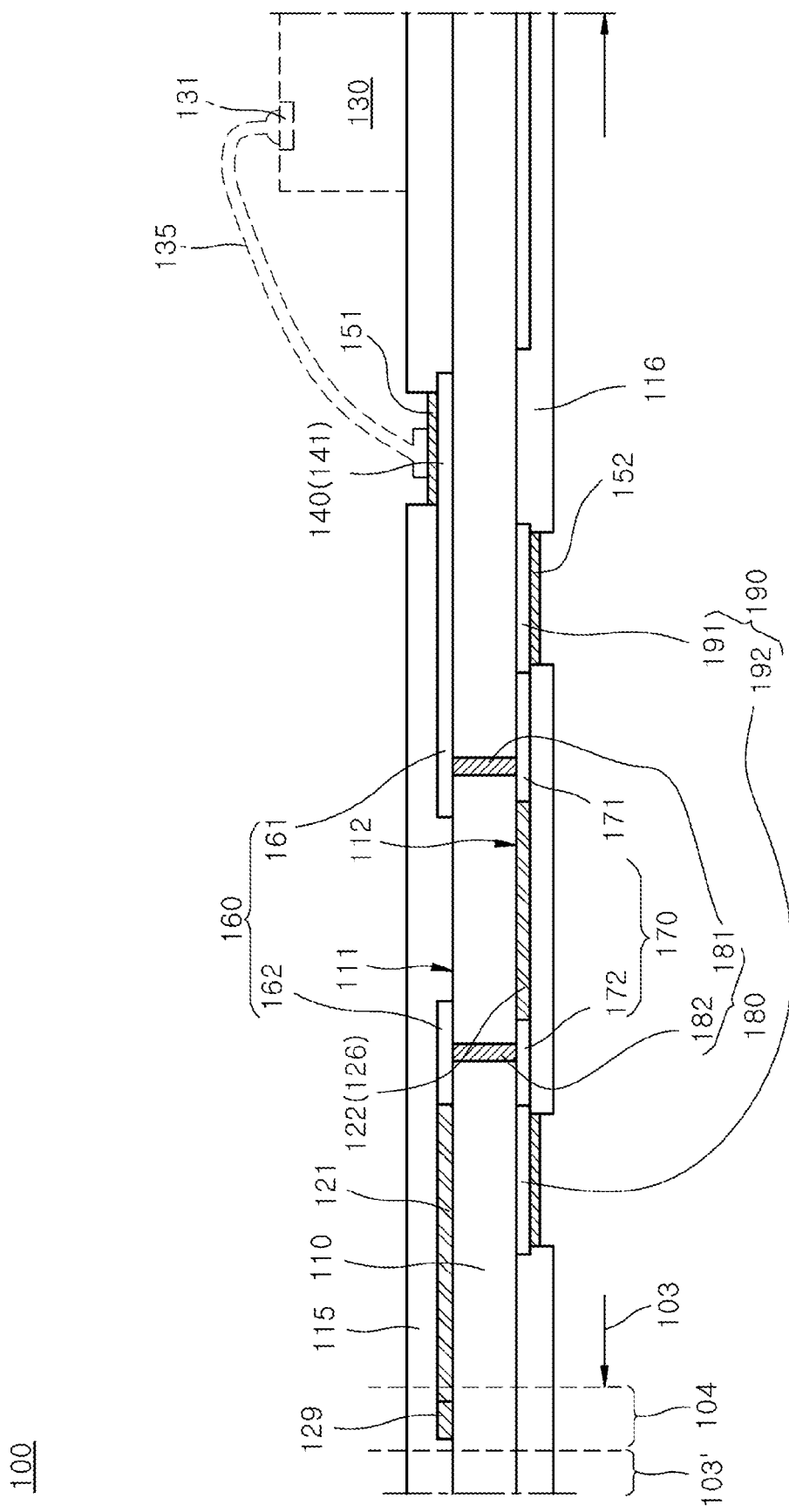
FIG. 2 is a cross-sectional view schematically illustrating a package substrate before formation of opening holes in an embodiment of the present disclosure.
Figure 3:
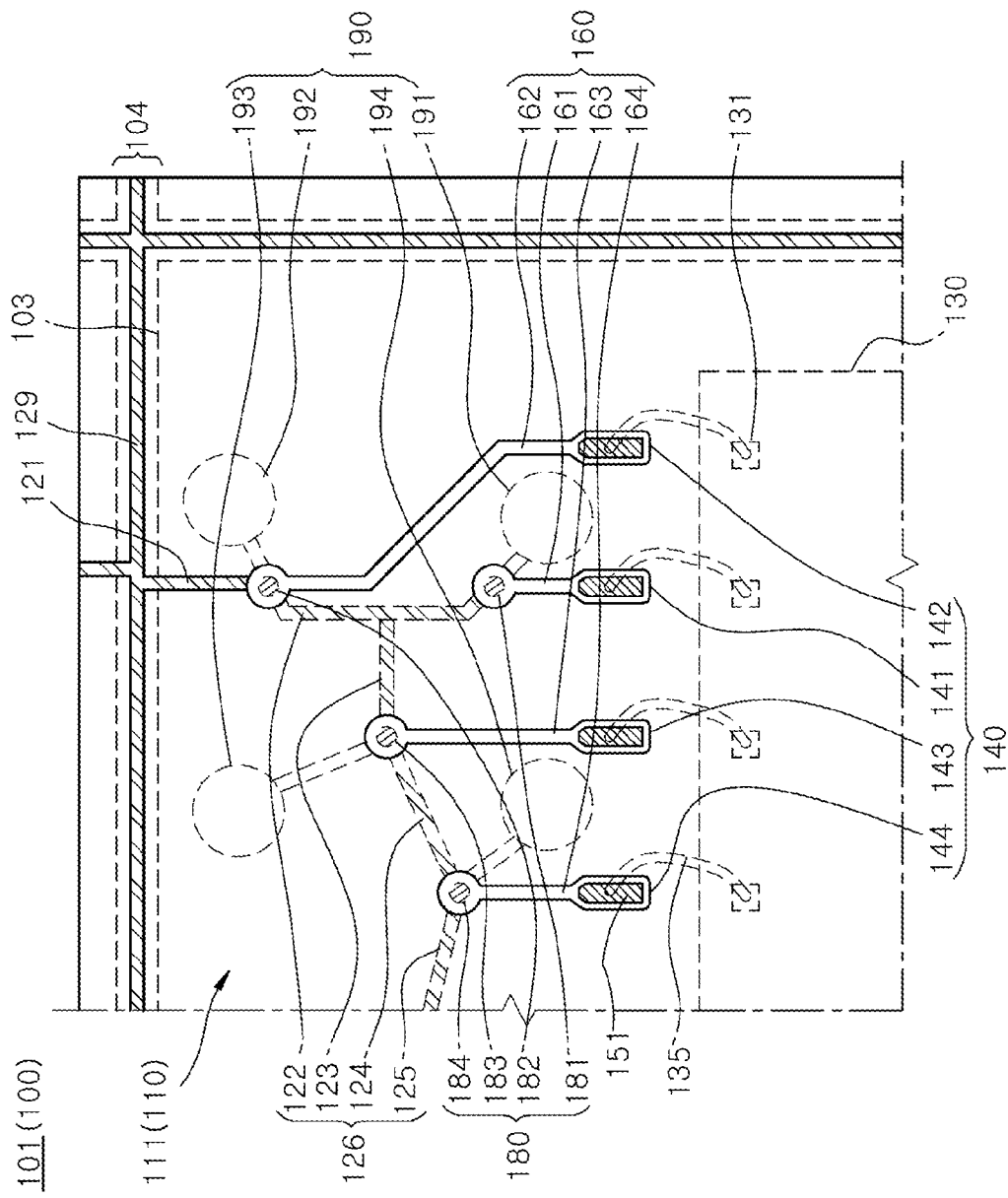
FIG. 3 is a plan view schematically illustrating a top circuit layout of the package substrate illustrated in FIG. 2.
Figure 4:
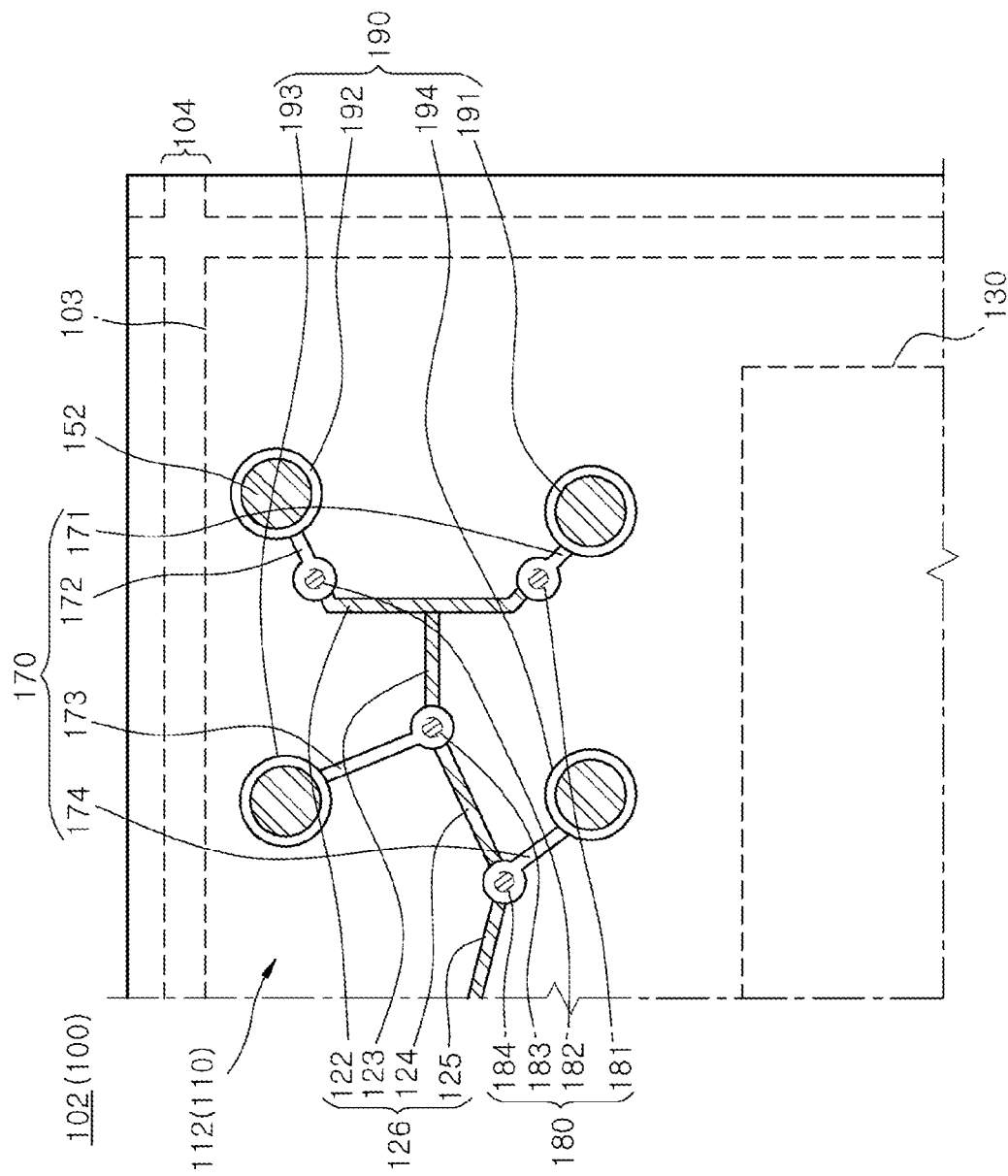
FIG. 4 is a plan view schematically illustrating a bottom circuit layout of the package substrate illustrated in FIG. 2.

FIG. 1 is a cross-sectional view illustrating a semiconductor package 10 according to an embodiment. FIG. 2 is a cross-sectional view illustrating a package substrate 100 included in a semiconductor package according to an embodiment. The package substrate 100 of FIG. 2 corresponds to a package substrate 100F illustrated in FIG. 1 before opening holes 117 of the package substrate 100F are formed. FIG. 3 is a plan view schematically illustrating a top circuit layout 101 of the package substrate 100 illustrated in FIG. 2. FIG. 4 is a plan view schematically illustrating a bottom circuit layout 102 of the package substrate 100 illustrated in FIG. 2.

Referring to FIG. 1, the semiconductor package 10 may include a semiconductor chip 130 mounted on the package substrate 100F. The package substrate 100F may include a plating lead line 121, first and second remaining portions 122A and 122B of a first provisional bridge line 122 for plating, and a first dam portion 122F of the first provisional bridge line 122 for plating. The first and second remaining portions 122A and 122B and the first dam portion 122F of the first provisional bridge line 122 for plating may be separated from each other by first and second opening holes 177A and 177B constituting any one of opening holes 117. A barrier 117D including the first dam portion 122F may be disposed between the first and second opening holes 117A and 117B.

The semiconductor chip 130 may be mounted on a first dielectric layer 115 of the package substrate 100F. A molding layer 139 may be disposed on the first dielectric layer 115 of the package substrate 100F to cover the semiconductor chip 130. Bonding wires 135 may be disposed to electrically connect contact pads 131 of the semiconductor chip 130 to bonding fingers 140 of the package substrate 100F. The bonding wires 135 may be connected to the bonding fingers 140 through a first plating layer 151. The package substrate 100F may also include a second plating layer 152, and solder balls 136 acting as outer connectors may be attached to the second plating layer 152.

Referring to FIG. 2, the package substrate 100 may correspond to a pre-package substrate having a status before the opening holes 117 illustrated in FIG. 1 are formed. The package substrate 100 may include a base layer 110 and plating lines disposed on the base layer 110. The base layer 110 may be a dielectric layer corresponding to a body or a core of the package substrate 100. The plating lines may include the plating lead line 121 and the first provisional bridge line 122 for plating. As illustrated in FIG. 3, the package substrate 100 may further include second to fourth provisional bridge lines 123, 124 and 125. The first to fourth provisional bridge lines 122, 123, 124 and 125 may constitute provisional bridge lines 126.

The base layer 110 may have a first surface 111 and a second surface 112 which are opposite to each other. The first dielectric layer 115 may be disposed on the first surface 111 of the base layer 110, and a second dielectric layer 116 may be disposed on the second surface 112 of the base layer 110. Each of the first and second dielectric layers 115 and 116 may be formed of a material layer including a solder resist layer. The package substrate 100 may be a printed circuit board (PCB). The package substrate 100 may have a ball grid array (BGA) structure.

The package substrate 100 may include a boundary region 104 and an inner region 103 which is surrounded by the boundary region 104 in a plan view. The package substrate 100 may also include another inner region 103' next to the inner region 103, and the other inner region 103' may be connected to the inner region 103 through the boundary region 104.

The semiconductor chip 130 may be mounted on the inner region 103 of the package substrate 100. The interconnection lines electrically connected to the semiconductor chip 130 may be disposed in the inner region 103. The semiconductor chip 130 may be mounted on the first surface 111 the base layer 110. The semiconductor chip 130 may be attached to the first dielectric layer 115. The boundary region 104 may be removed in a final step of a package process for encapsulating the semiconductor chip 130. The boundary region 104 may be removed by a sawing process for separating discrete semiconductor packages from each other after a plurality of semiconductor chips (including the semiconductor chip 130) mounted on the package substrate 100 are molded by the molding layer (139 of FIG. 1).

Referring to FIG. 3, the top circuit layout 101 may include top interconnection lines disposed on the first surface 111 of the base layer 110. As illustrated in the top circuit layout 101 of FIG. 3, the top interconnection lines may include the bonding fingers 140, trace patterns 160 of a first layer, and the plating lead line 121.

The bonding fingers 140 may be disposed on the first surface 111 of the base layer 110 to be spaced apart from each other. For example, the bonding fingers 140 may include first to fourth bonding fingers 141, 142, 143 and 144 which are disposed on the first surface 111 of the base layer 110 to be spaced apart from each other. The bonding fingers 140 may be disposed in the periphery of the semiconductor chip 130 to be electrically connected to the semiconductor chip 130.

The first bonding finger 141, the third bonding finger 143 and the fourth bonding finger 144 among the bonding fingers 140 may be used as portions of signal lines that transmit signals to the semiconductor chip 130. The signals transmitted by the first bonding finger 141, the third bonding finger 143 and the fourth bonding finger 144 may include data input/output (DQ) signals, address signals and command signals. Accordingly, the signals may be transmitted to or outputted from the semiconductor chip 130 through the first bonding finger 141, the third bonding finger 143 and the fourth bonding finger 144. Meanwhile, the second bonding finger 142 may be a portion of any one of non-signal lines. The non-signal lines may include a power line and a ground line. Thus, a power voltage or a ground voltage may be applied to the semiconductor chip 130 through the second bonding finger 142.

The trace patterns 160 of the first layer may be conductive lines extending from the bonding fingers 140. The trace patterns 160 of the first layer may electrically connect the bonding fingers 140 to conductive vias 180. The trace patterns 160 of the first layer may include first to fourth trace patterns 161, 162, 163 and 164.

Referring to FIGS. 2 and 4, the bottom circuit layout 102 may include bottom interconnection lines disposed on the second surface 112 of the base layer 110. As illustrated in the bottom circuit layout 102 of FIG. 4, the bottom interconnection lines may include ball lands 190, trace patterns 170 of a second layer, and the provisional bridge lines 126 for plating. The trace patterns 170 of the second layer may be disposed on the second surface 112 of the base layer 110.

The conductive vias 180 may electrically connect the trace patterns 160 of the first layer to the trace patterns 170 of the second layer. First ends of the conductive vias 180 may be respectively connected to the trace patterns 160 of the first layer, and second ends of the conductive vias 180 may be respectively connected to the trace patterns 170 of the second layer. The conductive vias 180 may be conductive patterns vertically penetrating the base layer 110. The trace patterns 170 of the second layer may include fifth to eighth trace patterns 171, 172, 173 and 174. The terms "first" to "eighth" used in the trace patterns 160 and 170 should not be limited by these terms. These terms "first" to "eighth" are only used to distinguish one element from another element, but not used to define only the element itself or to mean a particular sequence.

The ball lands 190 may be electrically connected to the trace patterns 170 of the second layer, respectively. The trace patterns 170 of the second layer may electrically connect the conductive vias 180 to the ball lands 190. Outer connectors (not shown) may be attached to the ball lands 190 to electrically connect the package substrate 100 to an external device or an external system. The outer connectors may include solder balls.

Referring to FIGS. 2 and 3, the bonding fingers 140 may be connected to the semiconductor chip 130 through inner connectors. For example, the fourth bonding finger 144 may be electrically connected to one of the contact pads 131 of the semiconductor chip 130 through one of the bonding wires 135. Although FIG. 3 illustrates an example in which the bonding wires 135 are used as the inner connectors, the inner connectors may be conductive members other than the bonding wires 135. For example, in some other embodiments, the inner connectors may be conductive bumps.

The first plating layer 151 may be formed on a portion of each of the bonding fingers 140. The first plating layer 151 may improve the bondability between the bonding wires 135 and the bonding fingers 140. In addition, the first plating layer 151 may improve a contact resistance value between the bonding wires 135 and the bonding fingers 140. If the bonding fingers 140 are formed of a copper layer, the first plating layer 151 may be formed of a material layer which is capable of preventing the copper layer from corrosion and contamination. The first plating layer 151 may be formed using an electrolytic plating process. The first plating layer 151 may be formed to include a conductive material different from the bonding fingers 140. For example, the first plating layer 151 may be formed to include a nickel layer and a gold layer.

Referring to FIGS. 2 and 4, the second plating layer 152 may be formed on each of the ball lands 190. The second plating layer 152 may be formed of a material layer which is capable of preventing the ball lands 190 from being oxidized. The second plating layer 152 may be formed of a material layer which is capable of suppressing excessive formation of an intermetallic compound material when the outer connectors (e.g., solder balls) are attached to the ball lands 190. The first and second plating layers 151 and 152 may be simultaneously formed using a single electrolytic plating process. Alternatively, the first and second plating layers 151 and 152 may be independently formed using two separate electrolytic plating processes.

Referring again to FIG. 2, the electrolytic plating process for forming the first and second plating layers 151 and 152 may require that a plating electric current is applied on the bonding fingers 140 and the ball lands 190. In such a case, the plating electric current may be applied on the bonding fingers 140 and the ball lands 190 through a plating line structure including the plating lead line 121, the provisional bridge lines 126 for plating, and a plating bus 129.

Referring to FIG. 3, the plating bus 129 may be disposed in the boundary region 104 of the package substrate 100. The plating bus 129 may be formed on the first surface 111 of the base layer 110 in the boundary region 104 of the package substrate 100. The plating lead line 121 may be conductive lines which are branched from the plating bus 129. The plating lead line 121 may extend from the plating bus 129 and may be electrically connected to the second bonding finger 142. For example, the plating lead line 121 may be coupled to the second trace pattern 162 and may be electrically connected to the second bonding finger 142 through the second trace pattern 162. Although not shown in the drawings, in some other embodiments, the plating lead line 121 may be directly connected to the second bonding finger 142 without any intervening elements therebetween.

The plating lead line 121 may be disposed on the first surface 111 of the base layer 110 and may be connected only to the second bonding finger 142 among the bonding fingers 140 disposed on the first surface 111 of the base layer 110. The plating lead line 121 may be connected to the second bonding finger 142 through the second trace pattern 162. The plating lead line 121 may be disposed on the first surface 111 of the base layer 110 to be spaced apart from the first bonding finger 141. The plating lead line 121 may not be directly connected to the first, third and fourth trace patterns 161, 163 and 164 on the first surface 111 of the base layer 110. The plating lead line 121 may not be directly connected to the first, third and fourth bonding fingers 141, 143 and 144 on the first surface 111 of the base layer 110.

The second bonding finger 142 and the second trace pattern 162 may constitute a portion of any one of non-signal lines such as a power line and a ground line. In contrast, the first bonding finger 141 and the first trace pattern 161 may constitute a portion of any one of signal lines, the third bonding finger 143 and the third trace pattern 163 may constitute a portion of another one of the signal lines, and the fourth bonding finger 144 and the fourth trace pattern 164 may constitute a portion of yet another one of the signal lines. The plating lead line 121 may be connected only to the non-signal lines disposed on the first surface 111 of the base layer 110 and may not be directly connected to the signal lines disposed on the first surface 111 of the base layer 110.

Referring to FIG. 2, while the plating lead line 121 and the plating bus 129 are disposed on the first surface 111 of the base layer 110, the provisional bridge lines 126 for plating may be disposed on the second surface 112 of the base layer 110. That is, the plating lead line 121 may be disposed on a surface of the base layer 110 opposite to the provisional bridge lines 126 for plating, and provisional bridge lines 126 for plating may be disposed on a surface of the base layer 110 opposite to the plating lead line 121.

Referring to FIG. 4, the provisional bridge lines 126 for plating may electrically connect the conductive vias 180, which are spaced apart from each other, to each other. Accordingly, a plating electric current between the conductive vias 180 may flow through the provisional bridge lines 126 for plating during the electrolytic plating process, and the provisional bridge lines 126 for plating may be cut away after the electrolytic plating. The plating electric current applied on the plating lead line 121 may flow through the provisional bridge lines 126 for plating and the conductive vias 180 to reach the first, third and fourth bonding fingers 141, 143 and 144.

Referring to FIGS. 2 and 4, the fifth trace pattern 171 electrically connected to a first ball land 191 of the ball lands 190 may be disposed on the second surface 112 of the base layer 110. The first ball land 191 may be electrically connected to a first conductive via 181 of the conductive vias 180. The fifth trace pattern 171 may be connected to the first conductive via 181 and may be electrically connected to the first trace pattern 161 through the first conductive via 181. The first ball land 191 may be electrically connected to the first bonding finger 141 through the fifth trace pattern 171, the first conductive via 181 and the first trace pattern 161. The first ball land 191, the fifth trace pattern 171, the first conductive via 181, the first trace pattern 161 and the first bonding finger 141 may provide one of the signal lines.

A second ball land 192 of the ball lands 190 may be disposed to be spaced apart from the first ball land 191. The second ball land 192 may be electrically connected to the second conductive via 182. A first provisional bridge line 122 of the provisional bridge lines 126 may electrically connect the first ball land 191 to the second ball land 192. The first provisional bridge line 122 may electrically connect the fifth trace pattern 171 to the sixth trace pattern 172. The fifth trace pattern 171 may electrically connect the first ball land 191 to the first conductive via 181. The sixth trace pattern 172 may electrically connect the second ball land 192 to the second conductive via 182. The first ball land 191 may be electrically connected to the second ball land 192 through the first provisional bridge line 122, the fifth trace pattern 171 and the sixth trace pattern 172. The first provisional bridge line 122 may electrically connect the first conductive via 181 to the second conductive via 182. The second ball land 192, the sixth trace pattern 172, the second conductive via 182, the second trace pattern 162 and the second bonding finger 142 may provide a power line or a ground line.

The fifth and sixth trace patterns 171 and 172 may be conductive patterns that are disposed on the second surface 112 of the base layer 110 to be spaced apart from each other. The second conductive via 182 may be disposed to be spaced apart from the first conductive via 181. The second conductive via 182 may be electrically connected to the plating lead line 121 on the first surface 111 of the base layer 110. The first conductive via 181 may be electrically connected to the first bonding finger 141 on the first surface 111 of the base layer 110.

The first provisional bridge line 122 may connect the first conductive via 181 to the second conductive via 182. The first provisional bridge line 122 may electrically connect the first bonding finger 141 and the first ball land 191 to the plating lead line 121. The plating electric current applied through the plating lead line 121 may flow through the first provisional bridge line 122 to reach the first bonding finger 141 and the first ball land 191.

The plating electric current applied through the plating bus 129 may flow through the plating lead line 121, the second trace pattern 162, the second conductive via 182, the sixth trace pattern 172, the first provisional bridge line 122, the fifth trace pattern 171, the first conductive via 181 and the first trace pattern 161 to reach the first bonding finger 141. Since the plating electric current is applied on the first bonding finger 141, the first plating layer 151 may be formed on the first bonding finger 141 by an electrolytic plating technique.

The plating electric current applied on the plating bus 129 may flow through the plating lead line 121, the second trace pattern 162, the second conductive via 182, the sixth trace pattern 172, the first provisional bridge line 122 and the fifth trace pattern 171 to reach the first ball land 191. When the plating electric current is simultaneously applied on the first bonding finger 141 and the first ball land 191, the first plating layer 151 and the second plating layer 152 may be simultaneously formed on the first bonding finger 141 and the first ball land 191 by the electrolytic plating technique, respectively.

The plating electric current applied on the plating bus 129 may flow through the plating lead line 121, the second trace pattern 162, the second conductive via 182 and the sixth trace pattern 172 to reach the second ball land 192. Because the second trace pattern 162 is connected to the second bonding finger 142 (see FIG. 3), the plating electric current applied through the plating bus 129 may also reach the second bonding finger 142. Thus, the first plating layer 151 and the second plating layer 152 may be simultaneously formed on the second bonding finger 142 and the second ball land 192 by the electrolytic plating technique, respectively.

Referring to FIGS. 3 and 4, a second provisional bridge line 123 of the provisional bridge lines 126 and the first provisional bridge line 122 of the provisional bridge lines 126 may electrically connect the plating lead line 121 to the third bonding finger 143 and a third ball land 193 of the ball lands 190. The second provisional bridge line 123 may electrically connect the first provisional bridge line 122 to the third conductive via 183 and the seventh trace pattern 173 connected to the third conductive via 183. Although FIG. 4 illustrates an example in which the second provisional bridge line 123 is directly connected to the first provisional bridge line 122, the second provisional bridge line 123 may be directly connected to the first and second ball lands 191 and 192 or the fifth and sixth trace patterns 171 and 172 in some other embodiments.

A third provisional bridge line 124 of the provisional bridge lines 126 and the first and second provisional bridge lines 122 and 123 may electrically connect the plating lead line 121 to the fourth bonding finger 144 and a fourth ball land 194 of the ball lands 190. The third provisional bridge line 124 may be electrically connected to the first provisional bridge line 122 through the second provisional bridge line 123. A fourth conductive via 184 of the conductive vias 180 may be electrically connected to the first provisional bridge line 122 through the second and third provisional bridge lines 123 and 124. The second provisional bridge line 123 may be electrically connected to the eighth trace pattern 174 and the fourth conductive via 184 through the third provisional bridge line 124.

A fourth provisional bridge line 125 of the provisional bridge lines may extend to electrically connect the plating lead line 121 to an additional bonding finger (not shown) of the bonding fingers 140 and an additional ball land (not shown) of the ball lands 190. That is, the plating lead line 121 may be electrically connected to the additional bonding finger and the additional ball land through the first to fourth provisional bridge lines 122, 123, 124 and 125.

As described above, the provisional bridge lines 126 may be provided to electrically connect the ball lands 190 to each other. The first, third and fourth bonding fingers 141, 143 and 144 may not be directly connected to the plating lead line 121 on the first surface 111 of the base layer 110. However, the first, third and fourth bonding fingers 141, 143 and 144 may be electrically connected to the plating lead line 121 through the provisional bridge lines 126 and the conductive vias 180.

Additional plating lead lines other than the plating lead line 121 may not be required on the first surface 111 of the base layer 110 because of the presence of the provisional bridge lines 126. That is, according to the embodiment, the additional plating lead lines for directly connecting the first, third and fourth bonding fingers 141, 143 and 144 to the plating lead line 121 may not be required.

When the plating electric current is applied through the plating bus 129, the plating lead line 121 and the provisional bridge lines 126, the first and second plating layers 151 and 152 may be formed by an electrolytic plating technique. After the first and second plating layers 151 and 152 are formed, the provisional bridge lines 126 may be cut away. That is, each of the provisional bridge lines 126 may be cut to have an electrical open state.

Figure 5:
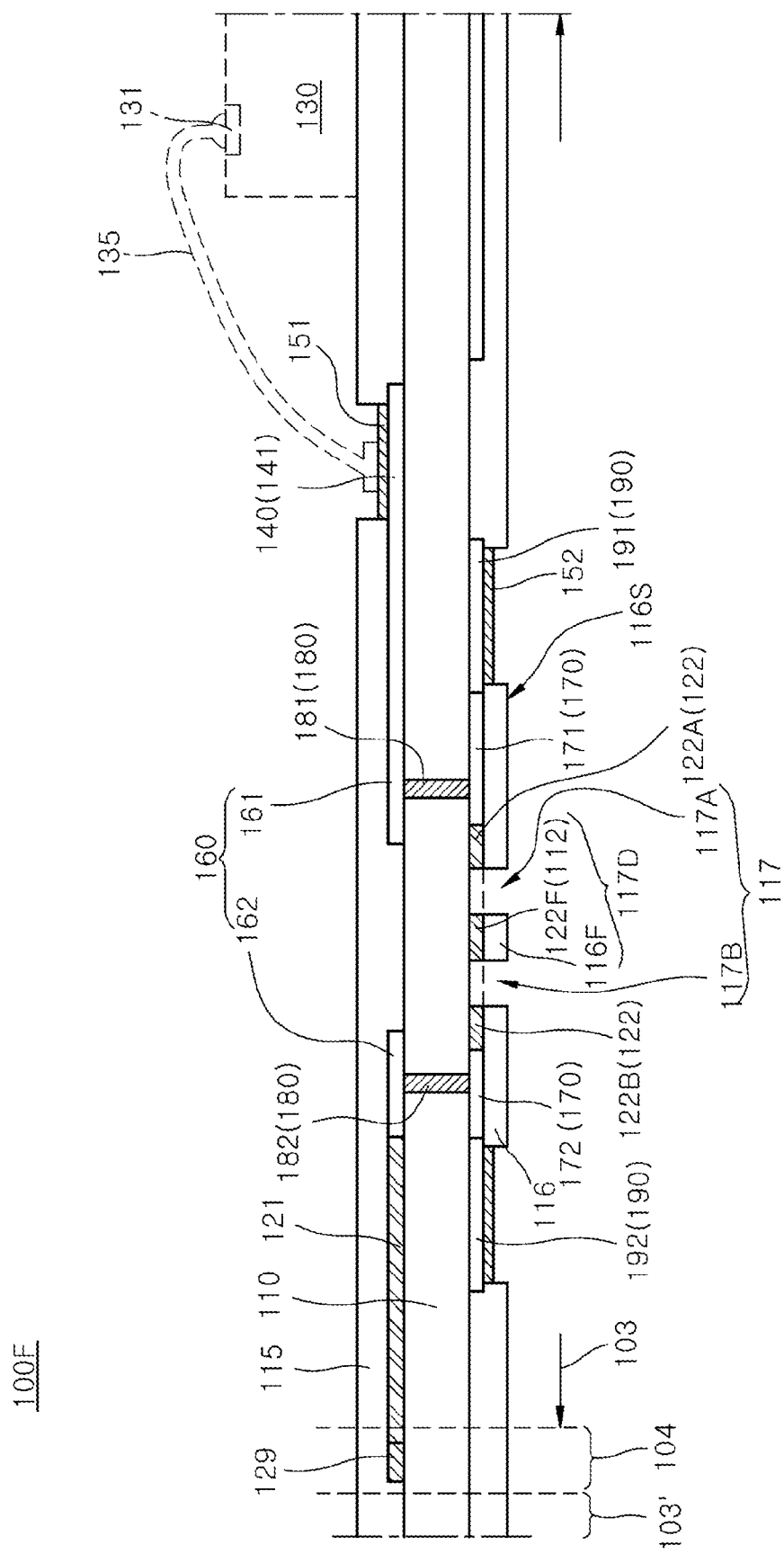
FIG. 5 is a cross-sectional view schematically illustrating a package substrate including opening holes in an embodiment of the present disclosure.
Figure 6:
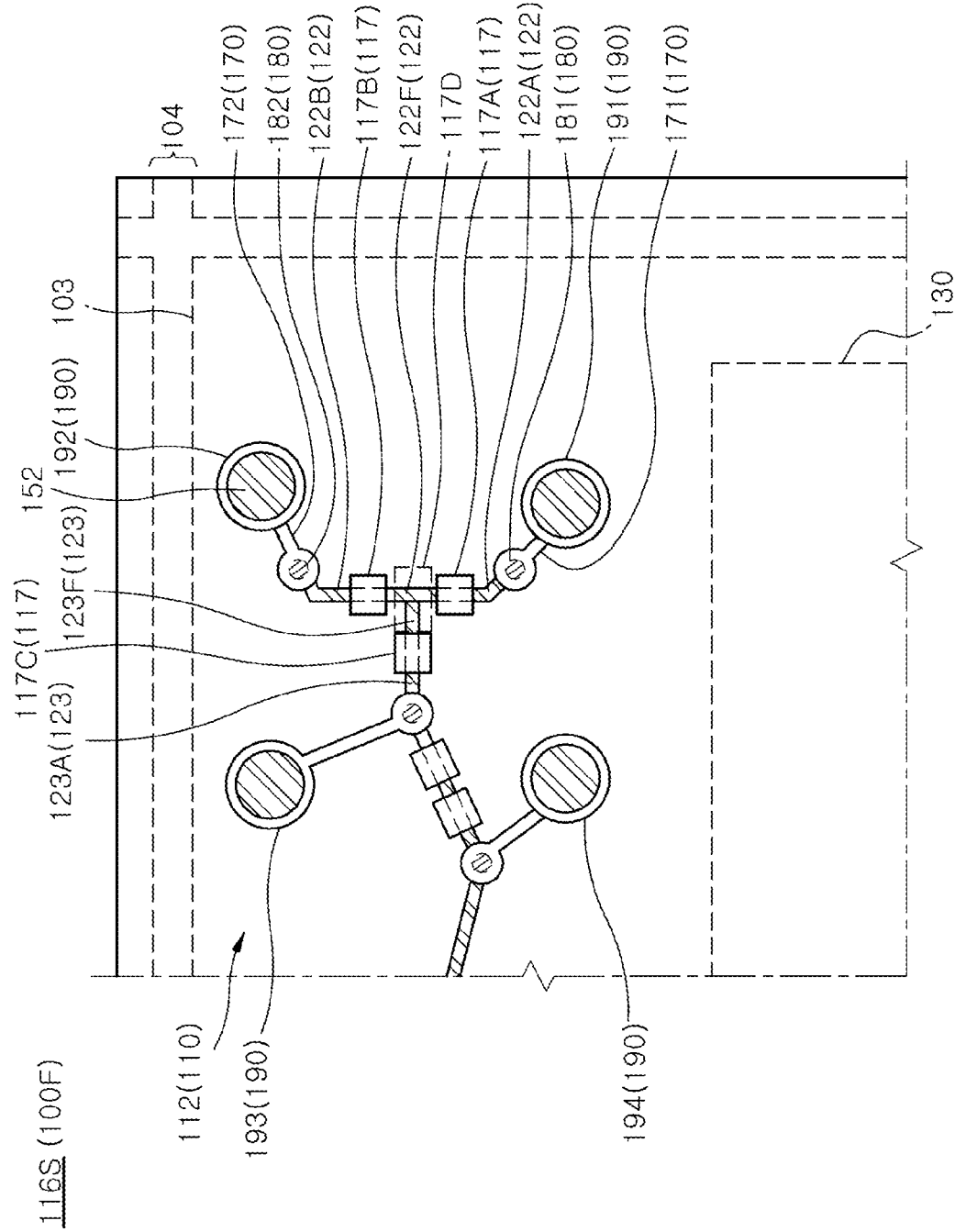
FIGS. 6 to 8 are plan views schematically illustrating package substrates including opening holes in some embodiments of the present disclosure.
Figure 7:
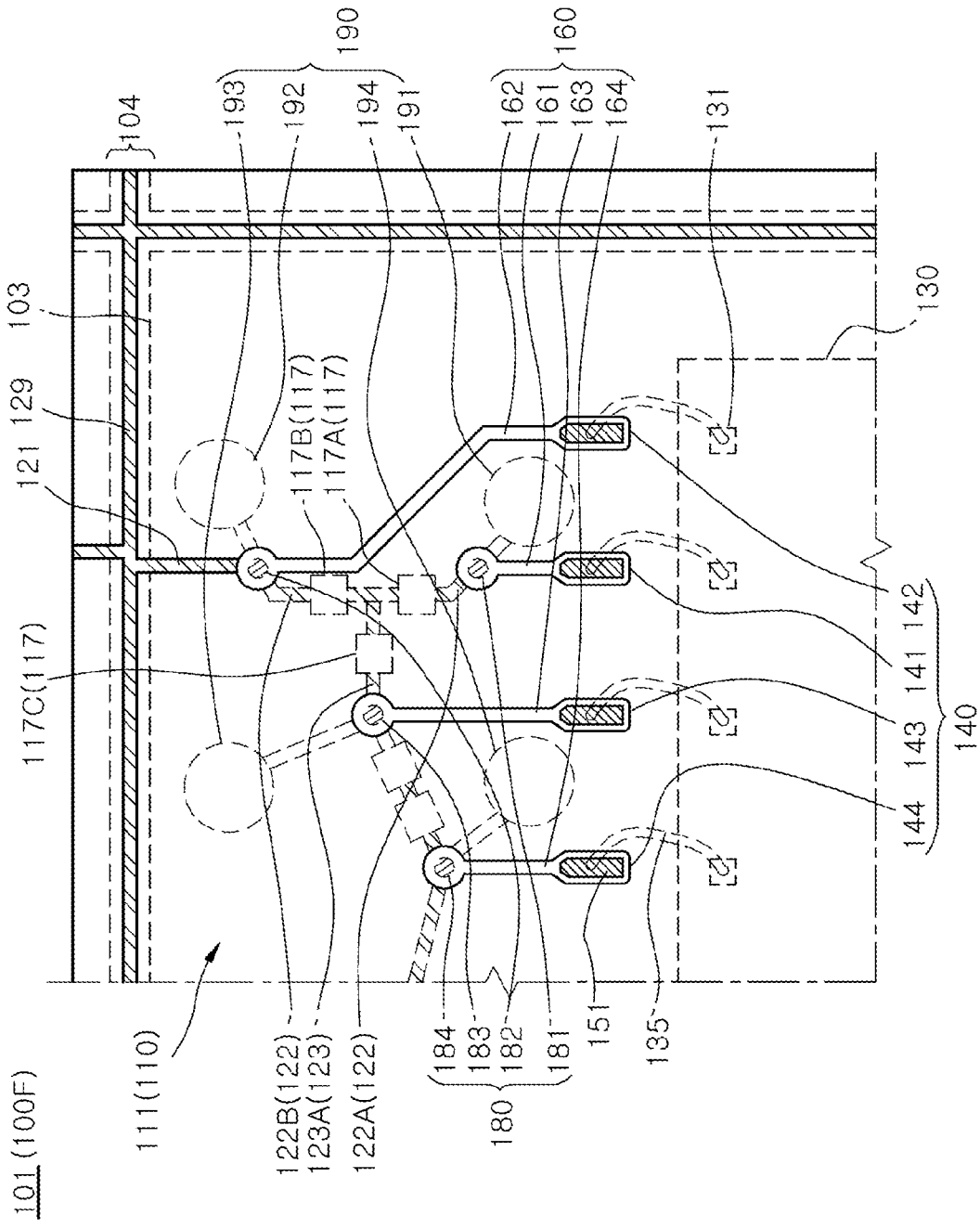

FIG. 5 is a cross-sectional view schematically illustrating the package substrate 100F including the opening holes 117 in an embodiment of the present disclosure. FIG. 6 is a plan view schematically illustrating a bottom surface 116S of the package substrate 100F including the opening holes 117 in an embodiment of the present disclosure. FIG. 7 is a plan view illustrating the top circuit layout 101 of the package substrate 100F illustrated in FIG. 5.

Referring to FIGS. 5 to 7, after the first and second plating layers 151 and 152 are formed, central portions of the provisional bridge lines 126 may be removed to form the opening holes 117. For example, the central portions of the first provisional bridge line 122 may be removed to form two of the opening holes 117 (i.e., the first and second opening holes 117A and 117B). The opening holes 117 may be formed at the bottom surface 116S of the package substrate 100F. The bottom surface 116S of the package substrate 100F may be provided by a surface of the second dielectric layer 116. The opening holes 117 may be formed to penetrate the second dielectric layer 116. The opening holes 117 may be formed using an etch process which is applied to portions of the second dielectric layer 116. The first and second opening holes 117A and 117B may be formed by removing portions of the second dielectric layer 116 to expose the central portions of the first provisional bridge line 122 and by removing the exposed central portions of the first provisional bridge line 122.

The opening holes 117 may include the first opening hole 117A, the second opening hole 117B and a third opening hole 117C which are adjacent to each other to constitute one group of opening holes. The first portion of the first provisional bridge line 122 may be removed to form the first opening hole 117A. The second opening hole 117B may be disposed to be spaced apart from the first opening hole 117A. The second portion of the first provisional bridge line 122 may be removed to form the second opening hole 117B. The third opening hole 117C may be disposed to be spaced apart from the first and second opening holes 117A and 117B. The central portion of the second provisional bridge line 123 may be removed to form the third opening hole 117C. The central portion of the first provisional bridge line 122 which is between the first opening hole 117A and the second opening hole 117B may remain. The first, second and third opening holes 117A, 117B and 117C may not be located in a straight line but located at three vertices of a triangle respectively.

The first provisional bridge line 122 may be separated into the first remaining portion 122A and the first dam portion 122F by the first opening hole 117A. The first provisional bridge line 122 may be further separated into the second remaining portion 122B and the first dam portion 122F by the second opening hole 117B. The second provisional bridge line 123 may be separated into a third remaining portion 123A and a second dam portion 123F by the third opening hole 117C. The first dam portion 122F may be a portion of the first provisional bridge line 122 that remains between the first opening hole 117A and the second opening hole 177B. The second dam portion 123F may be a portion of the second provisional bridge line 123 connected to the first dam portion 122F.

The first remaining portion 122A, the dam portions 122F and 123F, the second remaining portion 122B, and the third remaining portion 123A may be separated from each other by the opening holes 117. The first remaining portion 122A, the dam portions 122F and 123F, the second remaining portion 122B, and the third remaining portion 123A may be electrically disconnected from each other. That is, each of the first and second provisional bridge lines 122 and 123 may have an electrical open state due to the first remaining portion 122A, the dam portions 122F and 123F, the second remaining portion 122B, and the third remaining portion 123A which are electrically spaced apart from each other by the opening holes 117.

The first remaining portion 122A may be a portion of the first provisional bridge line 122, which is connected to the fifth trace pattern 171 and the first conductive via 181. The second remaining portion 122B may be another portion of the first provisional bridge line 122, which is connected to the sixth trace pattern 172 and the second conductive via 182. Thus, the first conductive via 181 is electrically separated from the second conductive via 182 by the first and second opening holes 117A and 117B. The first and second vias 181 and 182 may be electrically separated from the third ball land 193 by third opening hole 117C.

The first and second dam portions 122F and 123F may be conductive patterns which are electrically floated. That is, the first and second dam portions 122F and 123F may be electrically disconnected from other interconnection lines or other conductive lines adjacent thereto. While a certain voltage is applied to the first, second and third ball lands 191, 192 and 193, the first and second dam portions 122F and 123F may be electrically floated. While voltages applied to the first, second and third remaining portions are different from each other, the first and second dam portions 122F and 123F may be electrically floated.

The first and second dam portions 122F and 123F may be covered with portions 116F of the second dielectric layer 116. The portions 116F of the second dielectric layer 116 and the first and second dam portions 122F and 123F may constitute the barrier 117D.

Figure 8:
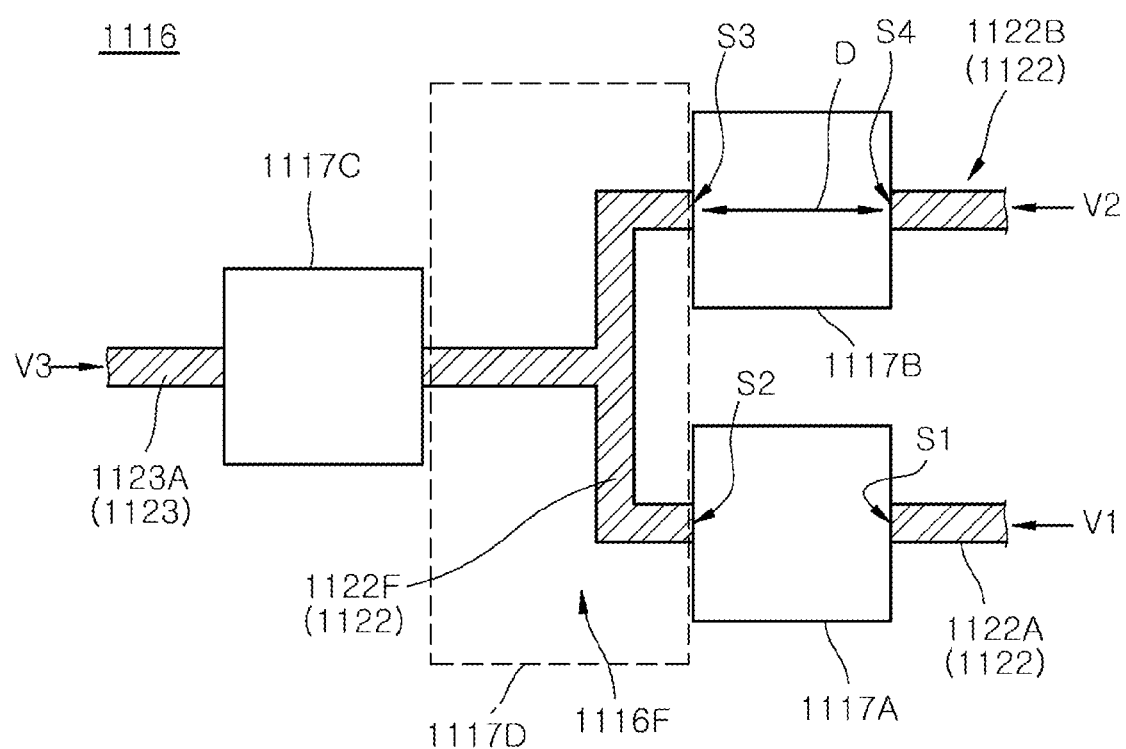

FIG. 8 is a plan view schematically illustrating a package substrate 1116 including first to third opening holes 1117A, 1117B and 1117C in an embodiment of the present disclosure.

Referring to FIG. 8, by the first to third opening holes 1117A, 1117B and 1117C, a first provisional bridge line 1122 and a second provisional bridge line 1123 may be separated into a first remaining portion 1122A, a second remaining portion 1122B, a third remaining portion 1123A and a first dam portion 1122F which are electrically disconnected from each other. A side surface S1 of the first remaining portion 1122A and a first side surface S2 of the first dam portion 1122F may be exposed along sidewalls of the first opening hole 1117A. A side surface S4 of the second remaining portion 1122B and a second side surface S3 of the first dam portion 1122F may be exposed along sidewalls of the second opening hole 1117B. The side surface S4 of the second remaining portion 1122B and second side surface S3 of the first dam portion 1122F may be spaced apart from each other by a width D of the second opening hole 1117B.

A barrier 1117D including the first dam portion 1122F may prevent the first to third remaining portions 1122A, 1122B and 1123A from being electrically connected to each other again by electrochemical migration (ECM). When the semiconductor package including the package substrate 1116 operates, first to third voltages V1, V2 and V3 may be applied to the first to third remaining portions 1122A, 1122B and 1123A respectively.

While two different voltages are applied to two separate electrodes with humidity, an ECM may occur between the two separate electrodes. A voltage difference between the two separate electrodes may cause a phenomenon that metal ions may be dissolved and migrated from one of the two separate electrodes toward the other one of the two separate electrodes. Usually ECM involves several stages: water adsorption, anode metal dissolution, ion accumulation, ion migration to cathode, and dendritic growth. Accordingly, the two separate electrodes may be electrically connected to each other to cause malfunction of a semiconductor package including the two separate electrodes.

The barrier 1117D may prevent the migration of metal ions and the growth of dendritic structures between two separate electrodes. That is, when two different voltages are applied to the first and third remaining portions 1122A and 1123A, the ECM may be suppressed or may be reduced due to presence of the barrier 1117D which is electrically floated. When two different voltages are applied to the second and third remaining portions 1122B and 1123A, the ECM may be suppressed or may be reduced due to presence of the barrier 1117D. In other words, the ECM may be suppressed or may be reduced regardless of levels of the first to third voltages V1, V2 and V3. A portion 1116F of a second dielectric layer covering the first dam portion 1122F may also suppress or reduce the ECM.

Referring again to FIG. 1, the package substrate 100F of the semiconductor package 10 may include the plating lead line 121, the first and second remaining portions 122A and 122B of the first provisional bridge line 122, and the first dam portion 122F of the first provisional bridge line 122. The barrier 117D may be disposed between the first and second opening holes 117A and 117B.

Referring again to FIGS. 1 and 3, the package substrate 100 may include a first group of conductive lines which are disposed on the first surface 111 of the base layer 110. The first group of conductive lines may include the trace patterns 160 of the first layer and the bonding fingers 140. Referring to FIGS. 2 and 4, the package substrate 100 may further include a second group of conductive lines which are disposed on the second surface 112 of the base layer 110. The second group of conductive lines may include the trace patterns 170 of the second layer and the ball lands 190. The second group of conductive lines may be electrically connected to the first group of conductive lines through the conductive vias 180, respectively. The plating lead line 121 may be connected to the first trace pattern 161 corresponding to one of the first group of conductive lines. The provisional bridge lines 126 may electrically connect the second group of conductive lines to each other.

One of the conductive lines, for example, the second trace pattern 162 may be connected to the plating lead line 121. The second trace pattern 162 may function as a power line for supplying a power voltage to the semiconductor chip 130. Alternatively, the second trace pattern 162 may act as a ground line for supplying a ground voltage to the semiconductor chip 130.

The portions of the first provisional bridge line 122 may be cut to provide the opening holes 117. The first remaining portion 122A, the second remaining portion 122B and the first dam portion 122F are separated from each other by the opening holes 117. In such a case, the first dam portion 122F may be disposed between the first remaining portion 122A and the second remaining portion 122B. The first dam portion 122F may be electrically floated. The first dam portion 122F and the portion 116F of the second dielectric layer 116 covering the first dam portion 122F may constitute the barrier 117D blocking the migration or segregation of metal ions.

Figure 9:
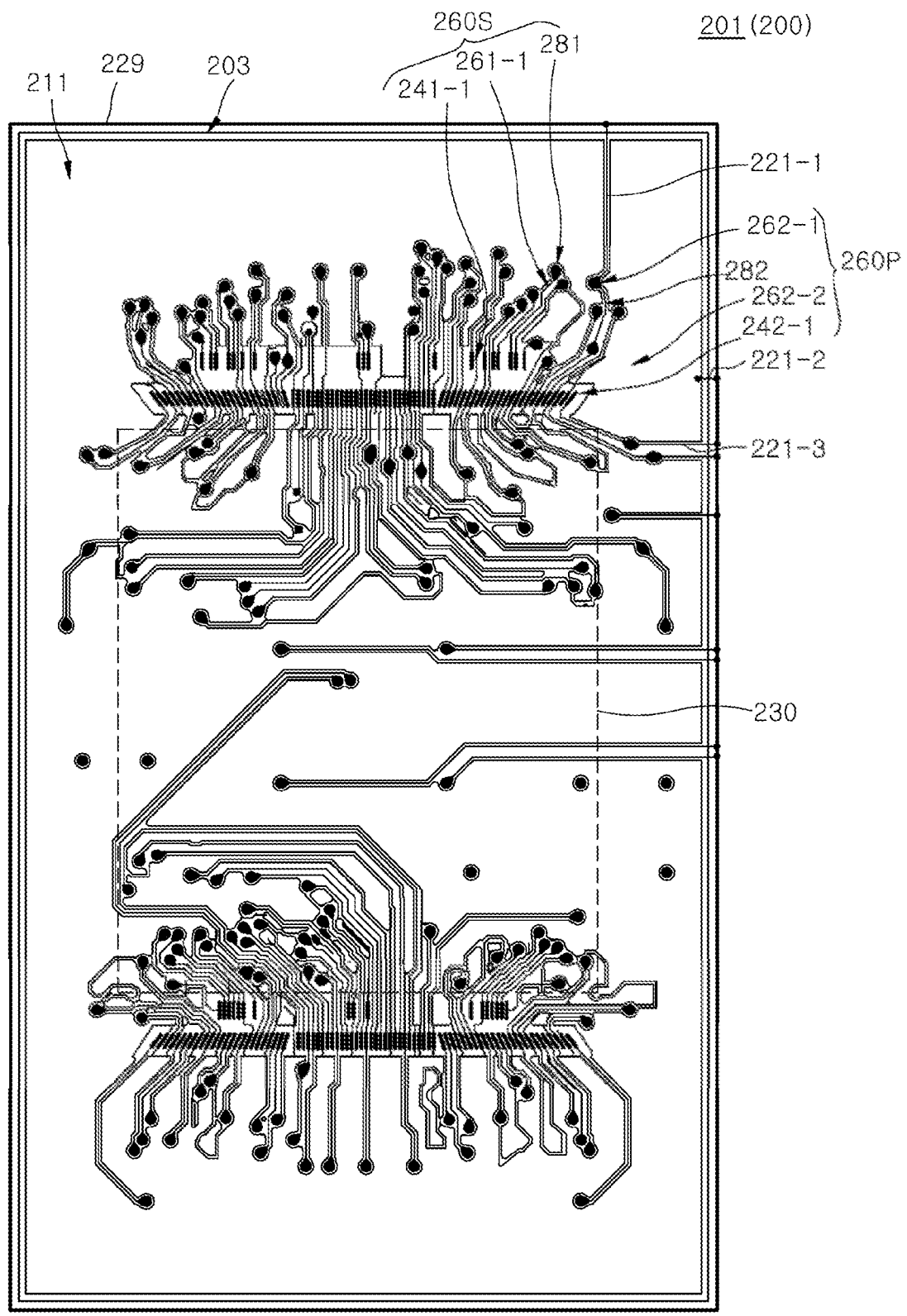
FIG. 9 is a plan view illustrating a top circuit layout of a package substrate included in a semiconductor package according to an embodiment of the present disclosure.
Figure 10:
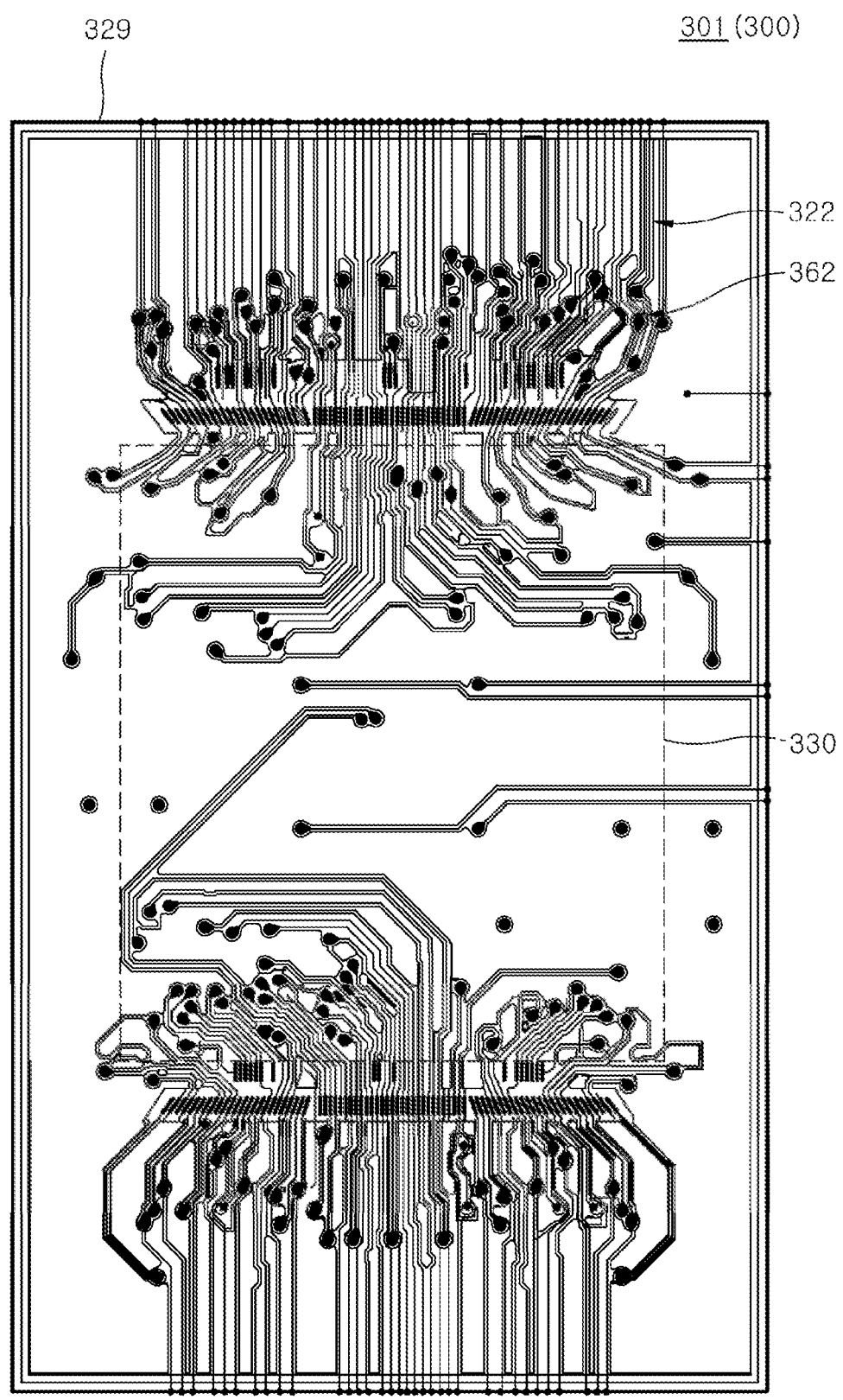
FIG. 10 is a plan view illustrating a top circuit layout of a package substrate included in a semiconductor package according to a comparative example.

FIG. 9 is a plan view illustrating a top circuit layout 201 of a package substrate 200 included in a semiconductor package according to an embodiment of the present disclosure. FIG. 10 is a plan view illustrating a top circuit layout 301 of a package substrate 300 included in a semiconductor package according to a comparative example.

The top circuit layout 201 of the package substrate 200 illustrates interconnection lines disposed on an inner region 203 of the package substrate 200. Plating lead lines 221-1, 221-2 and 221-3 may be designed not to be directly connected to first conductive lines 260S on a first surface 211 of a base layer of the package substrate 200. The first conductive lines 260S may include signal lines that transmit data signals and command/address signals to a semiconductor chip 230 mounted on the package substrate 200. The first conductive lines 260S may include a first trace pattern 261-1, a first bonding finger 241-1 and a first conductive via 281.

Each of the plating lead lines 221-1, 221-2 and 221-3 may be disposed to be connected to a non-signal lines such as a power line or a ground plane. For example, a first plating lead line 221-1 of the plating lead lines 221-1, 221-2 and 221-3 may be branched from a plating bus 229 and may be connected to second conductive lines 260P. The second conductive lines 260P may include a second trace pattern 262-1, a second bonding finger 242-1 and a second conductive via 282. The second conductive lines 260P may constitute a first power line for supplying a power voltage to the semiconductor chip 230. A second plating lead line 221-2 of the plating lead lines 221-1, 221-2 and 221-3 may be disposed to connect the plating bus 229 to a ground plane 262-2. A third plating lead line 221-3 of the plating lead lines 221-1, 221-2 and 221-3 may be disposed to connect a second power line to the plating bus 229.

The first to third plating lead lines 221-1, 221-2 and 221-3 may be disposed to be connected only to the power lines and the ground plane on the first surface 211 of the base layer of the package substrate 200. In contrast, the top circuit layout 301 of the package substrate 300 illustrated in FIG. 10 includes a lot of plating lead lines 322 branched from a plating bus 329. In the top circuit layout 301, the plating lead lines 322 may be connected to signal lines 362, which are electrically connected to a semiconductor chip 330 mounted on the package substrate 300, respectively. As such, the number of the plating lead lines 322 may be much greater than the number of the plating lead lines 221-1, 221-2 and 221-3.

The plating lead lines 322 may be connected to the signal lines 362, respectively. The plating lead lines 322 may be undesirable transmission lines while the semiconductor package operates. The plating lead lines 322 may act as stubs. Thus, when signals are inputted to or outputted from the semiconductor chip 330, the plating lead lines 322 may cause undesirable reflection of signals to degrade a signal integrity of the semiconductor package.

As can be seen from FIGS. 9 and 10, the number of the plating lead lines 221-1, 221-2 and 221-3 is much less than the number of plating lead lines 322. That is, a total length of the plating lead lines 221-1, 221-2 and 221-3 included in the package substrate 200 may be significantly reduced as compared with a total length of the plating lead lines 322 included in the package substrate 300. Moreover, the plating lead lines 221-1, 221-2 and 221-3 of FIG. 9 may not be electrically connected to the signal lines 260S. Thus, it may be possible to prevent the plating lead lines 221-1, 221-2 and 221-3 from acting as stubs.

According to the embodiments, the number of plating lead lines disposed in a semiconductor package may be remarkably reduced. That is, the number of the plating lead lines disposed on a package substrate of the semiconductor package may be reduced. This may lead to reduction of a total length of the plating lead lines. Accordingly, it may be possible to suppress that the plating lead lines degrade an operation characteristic or a signal integrity of the semiconductor package.

Figure 11:
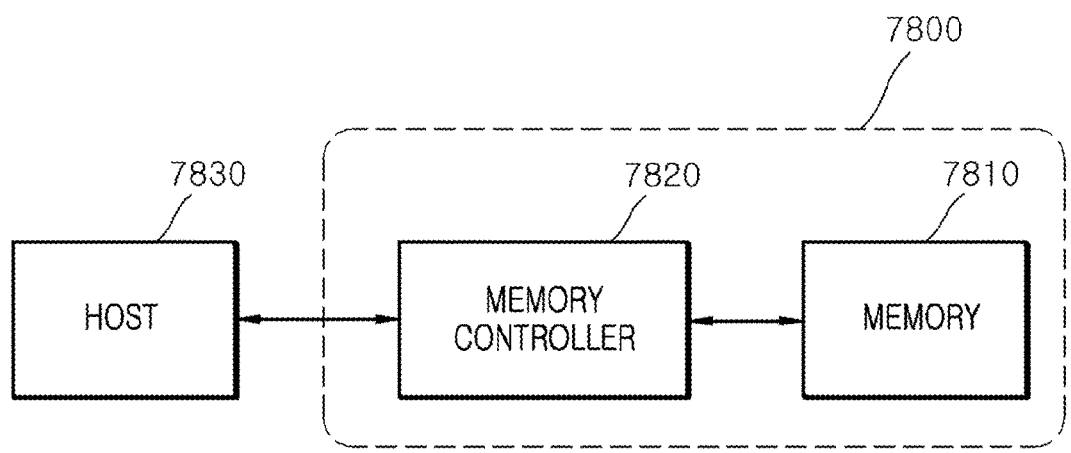
FIG. 11 is a block diagram illustrating an electronic system employing a memory card including at least one of semiconductor packages according to various embodiments.

FIG. 11 is a block diagram illustrating an electronic system including a memory card 7800 employing at least one of the semiconductor packages according to the embodiments. The memory card 7800 includes a memory 7810 such as a nonvolatile memory device, and a memory controller 7820. The memory 7810 and the memory controller 7820 may store data or read out the stored data. At least one of the memory 7810 and the memory controller 7820 may include at least one of the packages according to the embodiments.

The memory 7810 may include a nonvolatile memory device to which the technology of the embodiments of the present disclosure is applied. The memory controller 7820 may control the memory 7810 such that stored data is read out or data is stored in response to a read/write request from a host 7830.

Figure 12:
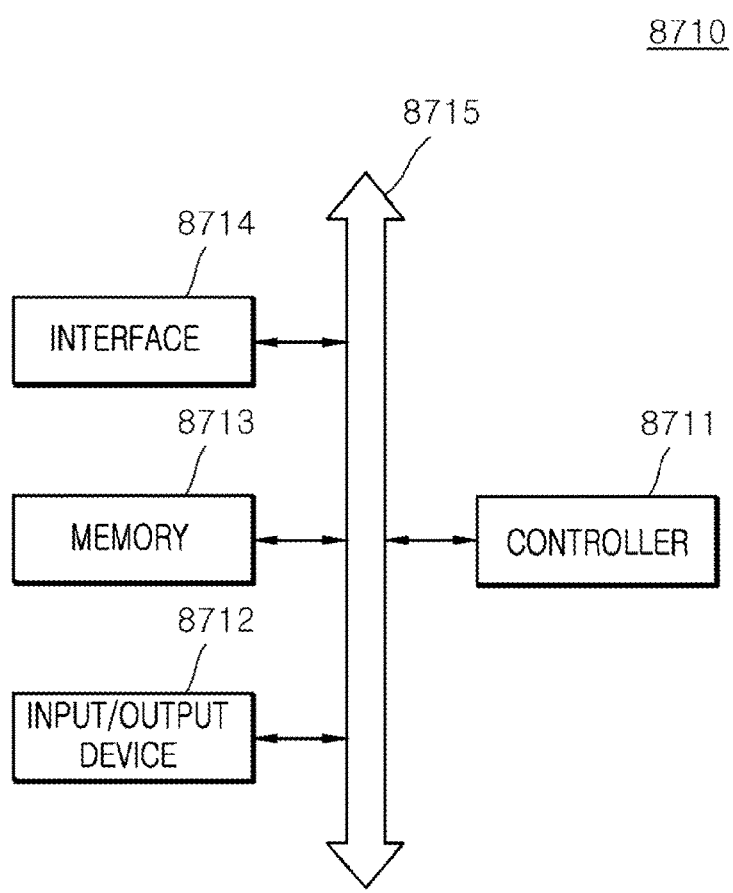
FIG. 12 is a block diagram illustrating an electronic system including at least one of semiconductor packages according to various embodiments.

FIG. 12 is a block diagram illustrating an electronic system 8710 including at least one of the semiconductor packages according to the embodiments. The electronic system 8710 may include a controller 8711, an input/output device 8712 and a memory 8713. The controller 8711, the input/output device 8712 and the memory 8713 may be coupled with one another through a bus 8715 providing a path through which data move.

In an embodiment, the controller 8711 may include one or more microprocessor, digital signal processor, microcontroller, and/or logic device capable of performing the same functions as these components. The controller 8711 or the memory 8713 may include one or more of the semiconductor packages according to the embodiments of the present disclosure. The input/output device 8712 may include at least one selected among a keypad, a keyboard, a display device, a touchscreen and so forth. The memory 8713 is a device for storing data. The memory 8713 may store data and/or commands to be executed by the controller 8711, and the like.

The memory 8713 may include a volatile memory device such as a DRAM and/or a nonvolatile memory device such as a flash memory. For example, a flash memory may be mounted to an information processing system such as a mobile terminal or a desktop computer. The flash memory may constitute a solid state disk (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer or a logic system performing various functions. For example, the mobile system may be any one of a personal digital assistant (PDA), a portable computer, a tablet computer, a mobile phone, a smart phone, a wireless phone, a laptop computer, a memory card, a digital music system and an information transmission/reception system.

If the electronic system 8710 is an equipment capable of performing wireless communication, the electronic system 8710 may be used in a communication system using a technique of CDMA (code division multiple access), GSM (global system for mobile communications), NADC (north American digital cellular), E-TDMA (enhanced-time division multiple access), WCDAM (wideband code division multiple access), CDMA2000, LTE (long term evolution) or Wibro (wireless broadband Internet).

Embodiments of the present disclosure have been disclosed for illustrative purposes. Those skilled in the art will appreciate that various modifications, additions and substitutions are possible, without departing from the scope and spirit of the present disclosure and the accompanying claims.

What is claimed is:

1. A semiconductor package comprising:
   a semiconductor chip; and
   a package substrate on which the semiconductor chip is mounted, wherein the package substrate includes:
   a base layer having a first surface and a second surface which are opposite to each other;
   a first bonding finger disposed on the first surface of the base layer;
   a plating lead line disposed on the first surface of the base layer to be spaced apart from the first bonding finger;
   a first conductive via disposed to substantially penetrate the base layer and electrically connected to the first bonding finger;
   a second conductive via disposed to substantially penetrate the base layer and electrically connected to the plating lead line;
   a first remaining portion electrically connected to the first conductive via;
   a second remaining portion electrically connected to the second conductive via;
   a first opening hole located between the first remaining portion and a dam portion such that the first remaining portion is electrically disconnected from the dam portion;
   a second opening hole located between the second remaining portion and the dam portion such that the second remaining portion is electrically disconnected from the dam portion; and
   a dielectric layer disposed on the second surface of the base layer,
   wherein the dielectric layer is penetrated by the first and second opening holes,
   wherein the first and second remaining portions and the dam portion are separated from a provisional bridge line by forming the first and second opening holes, and
   wherein the provisional bridge line is formed to electrically connect the first conductive via to the second conductive via.

2. The semiconductor package of claim 1, wherein a side surface of the first remaining portion and a first side surface of the dam portion are exposed by the first opening hole.

3. The semiconductor package of claim 2, wherein a side surface of the second remaining portion and a second side surface of the dam portion are exposed by the second opening hole.

4. The semiconductor package of claim 1, wherein the second conductive via is electrically separated from the first conductive via to electrically disconnect the plating lead line from the first bonding finger by the first opening hole and second opening hole.

5. A semiconductor package comprising:
   a semiconductor chip; and
   a package substrate on which the semiconductor chip is mounted,
   wherein the package substrate includes:
   a base layer having a first surface and a second surface which are opposite to each other;
   a first bonding finger, a second, a third and a fourth bonding fingers disposed on the first surface of the base layer to be arranged in a row and to be spaced apart from each other;
   a plating lead line disposed on the first surface of the base layer to be spaced apart from the first bonding finger;
   a first conductive via disposed to substantially penetrate the base layer and electrically connected to the first bonding finger;
   a second conductive via disposed to substantially penetrate the base layer and electrically connected to the plating lead line;
   a first remaining portion electrically connected to the first conductive via;
   a second remaining portion electrically connected to the second conductive via;
   a first opening hole located between the first remaining portion and a dam portion such that the first remaining portion is electrically disconnected from the dam portion;
   a second opening hole located between the second remaining portion and the dam portion such that the second remaining portion is electrically disconnected from the dam portion; and
   a dielectric layer disposed on the second surface of the base layer,
   wherein the dielectric layer is penetrated by the first and second opening holes, and
   wherein the plating lead line is electrically connected only to the second bonding finger not to the first, third and fourth bonding fingers.

6. The semiconductor package of claim 3, further comprising:
   a first trace pattern disposed on the first surface of the base layer to connect the first bonding finger to the first conductive via; and
   a second trace pattern spaced apart from the first trace pattern and disposed to connect the second bonding finger to the second conductive via.

7. The semiconductor package of claim 6, further comprising:
- a third bonding finger and a fourth bonding finger disposed on the first surface of the base layer to be spaced apart from the first and second bonding fingers and each other;
- a third conductive via and a fourth conductive via spaced apart from the first and second conductive vias and each other;
- a third trace pattern connecting the third bonding finger to the third conductive via; and
- a fourth trace pattern connecting the fourth bonding finger to the fourth conductive via.

8. The semiconductor package of claim 7, further comprising:
- a third remaining portion electrically connected to the third conductive via;
- a third opening hole located between the third remaining portion and the dam such that the third remaining portion is electrically disconnected from the dam portion.

9. The semiconductor package of claim 8, further comprising:
- a fourth remaining portion electrically connected to the fourth conductive via;
- a fourth opening hole located between the fourth remaining portion and the third conductive via such that the fourth remaining portion is electrically disconnected from the third conductive via.

10. The semiconductor package of claim 6, further comprising;
- a fifth trace pattern disposed on the second surface of the base layer and electrically connected to the first conductive via;
- a first ball land electrically connected to the fifth trace pattern;
- a sixth trace pattern disposed on the second surface of the base layer and electrically connected to the second conductive via; and
- a second ball land electrically connected to the sixth trace pattern.

11. The semiconductor package of claim 10, wherein the first ball land, the fifth trace pattern, the first conductive via, the first trace pattern and the first bonding finger constitute a signal line configured to transmit at least one of a data signal, an address signal or a command signal to the semiconductor chip.

12. The semiconductor package of claim 10, wherein the second ball land, the sixth trace pattern, the second conductive via, the second trace pattern and the second bonding finger constitute a power line configured to supply a power voltage to the semiconductor chip.

13. The semiconductor package of claim 10, wherein the second ball land, the sixth trace pattern, the second conductive via, the second trace pattern and the second bonding finger constitute a ground line configured to supply a ground voltage to the semiconductor chip.

14. The semiconductor package of claim 1, wherein the dielectric layer extends to cover the first remaining portion, the dam portion, and the second remaining portion.

15. A semiconductor package comprising:
- a semiconductor chip; and
- a package substrate on which the semiconductor chip is mounted, wherein the package substrate includes:
- a base layer having a first surface and a second surface which are opposite to each other;
- a first group of conductive lines disposed on the first surface of the base layer;
- a second group of conductive lines disposed on the second surface of the base layer and electrically connected to respective ones of the first group of conductive lines;
- a plating lead line electrically connected to only one of the first group of conductive lines;
- a conductive line from the second group of conductive lines includes a dam portion located between a first opening hole and a second opening hole of the conductive line, the first opening hole located between a first remaining portion of the conductive line and the dam portion and the second opening hole located between a second remaining portion of the conductive line and the dam portion such that the dam portion is electrically disconnected from the first and second remaining portions; and
- a dielectric layer disposed on the second surface of the base layer,
- wherein the dielectric layer is penetrated by the first and second opening holes,
- wherein the first and second remaining portions and the dam portion are separated from a provisional bridge line by forming the first and second opening holes, and
- wherein the provisional bridge line is formed to electrically connect a first conductive via to a second conductive via.

16. The semiconductor package of claim 15, wherein a side surface of the first remaining portion and a first side surface of the dam portion are exposed by the first opening hole.

17. The semiconductor package of claim 16, wherein a side surface of the second remaining portion and a second side surface of the dam portion are exposed by the second opening hole.

18. The semiconductor package of claim 15, further comprising:
- a first plating layer formed on a portion of each of the first group of conductive lines; and
- a second plating layer formed on a portion of each of the second group of conductive lines.

19. The semiconductor package of claim 15,
wherein the dielectric layer extends to cover the first remaining portion, the dam portion, and the second remaining portion.

* * * * *